United States Patent
Rampey et al.

(10) Patent No.: US 11,228,166 B1
(45) Date of Patent: Jan. 18, 2022

(54) FREE-STANDING CABLE TRAY SUPPORT SYSTEM AND METHOD OF ASSEMBLY

(71) Applicant: M.C. Dean, Inc., Tysons, VA (US)

(72) Inventors: Walter Edward Rampey, Leesburg, VA (US); Qiang Gu, Tysons, VA (US)

(73) Assignee: M.C. DEAN INC., Tysons, VA (US)

( * ) Notice: Subject to any disclaimer, the term of this patent is extended or adjusted under 35 U.S.C. 154(b) by 0 days.

(21) Appl. No.: 17/029,346

(22) Filed: Sep. 23, 2020

(51) Int. Cl.
*H02G 3/04* (2006.01)
*F16L 3/26* (2006.01)

(52) U.S. Cl.
CPC ............ *H02G 3/0456* (2013.01); *F16L 3/26* (2013.01)

(58) Field of Classification Search
CPC ........... F16L 3/26; H02G 3/0456; H02G 3/26; H02G 3/263; H02G 3/28; H02G 3/281; H02G 3/30; H02G 3/381; H02G 3/383; H02G 3/385; H02G 3/283; H02G 3/285; H05K 7/1497; E04B 1/2608
See application file for complete search history.

(56) References Cited

U.S. PATENT DOCUMENTS

| | | | | |
|---|---|---|---|---|
| 3,923,277 A | * | 12/1975 | Perrault | H02G 3/0456 248/49 |
| 4,232,845 A | * | 11/1980 | Turner | F16L 3/26 174/101 |
| 5,769,365 A | * | 6/1998 | Onishi | F16L 3/2431 248/49 |
| 5,911,231 A | * | 6/1999 | Turner | B60S 3/04 134/123 |

(Continued)

FOREIGN PATENT DOCUMENTS

| | | |
|---|---|---|
| DE | 102018124484 A1 | 4/2020 |
| EP | 2136447 A1 | 12/2009 |
| KR | 101819210 B1 | 1/2018 |

OTHER PUBLICATIONS https://www.racksolutions.com/news/blog/server-rack-sizes/.*
Maxrack—High-Density Racks (https://hoffman.nvent.com/wcsstore/AuroraStorefrontAssetStore/User%20Downloads/Literature%20Requests/content_Bro-00015.pdf).
Floor stand 19" 42u 800x1000 server rack cabinet (https://www.alibaba.com/product-detail/floor-stand-19-42u-800x1000-server_60436330841.html).

*Primary Examiner* — Christopher Garft
(74) *Attorney, Agent, or Firm* — Roberts Calderon Safran & Cole P.C.

(57) ABSTRACT

A cable tray support system for supporting cables above an array of server racks in a data center is provided, along with a method of assembly. The system includes a free-standing cable tray support structure having vertical support posts disposed between the server racks in the array linked together by horizontal support members. Coupling assemblies couple the top ends of each vertical support posts with opposing ends of two horizontal support members arranged. The horizontal support members are sized to space the plurality of vertical support posts between the server racks of the array when the vertical support posts are coupled thereto. Tray supports mounted on along the horizontal support members support an upper and lower cable tray. Floor mounts anchor the bottom ends of the vertical support posts to the floor. The cable tray support structure may be assembled either before or after the array of server racks is installed in the data center, as it is mechanically independent from the server racks and ventilation components and is supported only by the floor.

8 Claims, 8 Drawing Sheets

(56) References Cited

U.S. PATENT DOCUMENTS

| | | | |
|---|---|---|---|
| 6,427,400 B1 * | 8/2002 | Greenblatt | E04F 15/02458 |
| | | | 248/49 |
| 6,644,601 B2 * | 11/2003 | Aussiker | H02G 1/14 |
| | | | 248/125.8 |
| 6,672,022 B2 | 1/2004 | Simmons | |
| 7,373,759 B1 | 5/2008 | Simmons | |
| 8,151,535 B1 * | 4/2012 | Thompson | E04B 1/2608 |
| | | | 52/715 |
| 8,215,498 B2 * | 7/2012 | Rathbone | H05K 7/1497 |
| | | | 211/26.2 |
| 9,106,064 B2 | 8/2015 | Anderson et al. | |
| 10,098,248 B1 | 10/2018 | Klinger et al. | |
| 10,143,105 B1 * | 11/2018 | Ziegler | H05K 7/1492 |
| 10,212,851 B2 * | 2/2019 | Rimler | H05K 7/20709 |
| 10,238,008 B2 | 3/2019 | Gosselin et al. | |
| 2008/0017760 A1 * | 1/2008 | Larsen | H02G 3/0443 |
| | | | 248/49 |
| 2008/0023212 A1 * | 1/2008 | Larsen | H02G 3/0443 |
| | | | 174/101 |
| 2009/0319650 A1 * | 12/2009 | Collins | G06F 9/5094 |
| | | | 709/223 |
| 2010/0144265 A1 * | 6/2010 | Bednarcik | H05K 7/20745 |
| | | | 454/184 |
| 2014/0144852 A1 | 5/2014 | Oracle | |
| 2014/0367161 A1 | 12/2014 | Anderson et al. | |
| 2015/0098177 A1 * | 4/2015 | Wilcox | H05K 7/1492 |
| | | | 361/679.31 |
| 2015/0259938 A1 * | 9/2015 | Bernard | A47B 87/008 |
| | | | 52/64 |
| 2016/0029504 A1 | 1/2016 | Nordin et al. | |
| 2017/0127568 A1 * | 5/2017 | Rimler | E04B 9/02 |
| 2017/0127569 A1 | 5/2017 | Rimler et al. | |
| 2018/0132385 A1 | 5/2018 | Gosselin et al. | |
| 2020/0021090 A1 * | 1/2020 | Ziegler | A47B 47/021 |

\* cited by examiner

FREE-STANDING CABLE TRAY SUPPORT SYSTEM AND METHOD OF ASSEMBLY

FIELD

This invention generally relates to a cable tray support system and method of assembly, and is specifically concerned with a cable tray support structure supported exclusively by the floor of a building that stands over an array of server racks. The assembly method allows the support structure to be assembled either before or after the array server racks are arrayed on the floor of the building.

BACKGROUND

In buildings such as data centers that house a high density of digital processing equipment, there is a need for a structure to support the large numbers of communication and power cables that link together and power the computer servers and other equipment. To this end, such communication and power cables are typically laid into cable trays that are positioned above the tops of a row of server racks by a cable tray support structure.

The mechanical loads applied to such cable tray support structures are quite large. Modern "mission-critical" data centers require redundant sets of power sources to provide a reliable, uninterrupted flow of electrical power to the digital processing equipment. Since such redundant power requirements doubles the number of copper-laden power cables, busways, and busplugs that the cable support system must bear, the resulting mechanical load on the cable trays can amount to 131 lbs. per linear foot or more.

Different types of support structures have been developed in the prior art to support the heavily-laden cable trays. Some of these prior art systems include rows of cable-supporting brackets suspended from rails attached to the ceiling of the building. The rows of hanging brackets are mounted over rows of server racks and other data-processing equipment. Each of the brackets is shaped like an inverted "T", where the stem corresponds to a vertical support member, and the two sides of the hat of the inverted "T" correspond to a pair of opposing support arms for supporting cable trays on either side of the vertical support member. After installation of the hanging brackets, cable tray sections are mounted on the opposing support arms to form two, parallel cable trays on either side of each row of brackets.

In other prior art systems, the server racks are specially designed to include support brackets for the cable trays, thus obviating the need for a completely separate cable tray support structure. In such systems, the server racks may also support ventilation system components of the data center or other building where the array of server racks are installed to further reduce the need for separate mechanical support structures for the cable trays and ventilation systems.

SUMMARY OF THE INVENTION

While such prior art cable tray support systems have proven to be useful, the applicant has observed a number of shortcomings in such systems that limit their utility. For example, ceiling-mounted support structures require substantial effort to install, as the workmen must work against gravity in drilling the necessary mounting holes in the ceiling and lifting and bolting the bracket-supporting rails into place. The number and size of the ceiling-mounted anchoring bolts necessary to secure the support structure is substantial, as such a support structure must support its own considerable weight in addition to the 131 lbs. per linear foot applied by the cables. Such ceiling-mounted structures must be installed before the installation of the server racks, as it is difficult and expensive to install the ceiling-mounted support rails around an array of installed server racks. This in turn disadvantageously imposes a constraint on the sequencing of the construction of the data center. Finally, the ever-increasing density of the amount of computer servers housed in data center buildings has necessitated larger ventilation systems to deal with the resulting heat load. As a result, it is becoming more difficult, if not impossible to install a ceiling-supported support system without mechanically interfering with the ventilation plenums and duct work that are mounted over the arrays of server racks.

The previously-described integrated server rack support systems avoid some of the shortcomings of ceiling-mounted support structures, but require specially-built server racks designed to support the additional 131lb. per linear foot load of the cables which in turn substantially increases the costs of the server racks. Additionally, the location of the cable tray support brackets on the specially-built server racks may interfere with the ventilation plenums and duct work that are mounted over the arrays of server racks. While this problem might be avoided when such specially-built server racks also function to support components of the building ventilation system, the sizing of the support components must be coordinated with the dimensions of the ventilation components and the height of the ceilings where they mounted, which in turn requires the precise sizing of a substantial number of parts and a relatively time consuming installation process. Additionally, the higher complexity of the installation process associated with such an integrated support system again imposes sequencing constraints on the construction steps of the data center.

Consequently, there is a need for a cable tray support system that can be easily and inexpensively installed in a data center without interfering with overhead-mounted plenums, ductwork, or other components of the ventilation cooling system of the building. Ideally, such a support system would not rely upon the building ceiling or require specially-designed server racks for support. Finally, such a support system should be installable either before or after the installation of the server racks and the ventilation components of the cooling system to afford the building contractor a broad range of flexibility in sequencing the construction of the data center.

To these ends, the cable tray support system of the invention is a free-standing structure, and generally comprises a pair of columns of vertical support posts disposed between server racks in the array, each of which has a top end extending above the server racks, and a bottom end engaging a same floor that supports the server racks, and a pair of rows of horizontal support members interconnecting the top ends of each of the pair of columns of vertical support posts. A plurality of tray supports are mounted on at least one of the rows of horizontal support members, and side cable trays supported by the tray supports are mounted on the pair of rows of horizontal support members.

The inventive cable tray support structure is supported only by the floor, and is mechanically independent not only from the server racks, but from the ventilation components as well. Consequently, it does not require specially-designed server racks for support, and may be used in conjunction with a broad array of commercially-available server racks. Because of its mechanical independence from the server racks, and the fact that the vertical support posts are disposed between server racks of the array, the inventive support structure may be assembled either before or after the installation of the server racks, thereby advantageously providing the building contractor with a broad range of flexibility in the sequencing of construction steps. In contrast to ceiling-mounted support structures, it can be quickly and easily assembled from the floor of the building.

The inventive cable tray support structure preferably includes both floor mounts for anchoring the bottom ends of the vertical support posts to the floor, and a plurality of coupling assemblies interconnecting the top ends of the vertical support posts and adjoining ends of the horizontal support members. The lengths of the horizontal members are selected such that the coupling assemblies space the vertical support posts between the server racks. In the preferred embodiment, the lengths of the horizontal members space the vertical support posts between every two server racks. Each of the coupling assemblies mounts the ends of two adjacent horizontal support members in an overlapping relationship with the top of one of the vertical support posts. The coupling assemblies include a pair of opposing L-shaped brackets, each having a first leg mounted on the top end of one of the vertical support posts, and a second leg mounted on one of the horizontal support members. Each of the opposing L-shaped brackets further includes a reinforcing flange between its first and second legs, and a mounting flange extending from its second leg affixed to a side of adjoining ends of the horizontal support members.

The use of floor mounts that anchor the bottom ends of the vertical support posts to the floor advantageously maintains the vertical support posts in a true vertical position when the power and communication cables are laid and dragged through the cable trays, thereby maintaining the load carrying capacity of the support structure. The use of coupling assemblies formed from a pair of opposing L-shaped brackets to secure the ends of the horizontal support members in overlapping relationship over the top ends of the vertical support posts effectively directs the vertical load applied by the horizontal support members from the cable trays to the vertical support posts, and advantageously distributes the load over a broader area around the top end of the support posts.

The inventive cable tray support structure may further comprise a plurality of bridging members extending across and interconnecting the pair of rows of horizontal support members, and at least one bridging cable tray that is supported by the bridging members. The horizontal support members include a plurality of cable tray support affixing sections for adjustably receiving and affixing the tray supports, the number of cable tray support affixing sections being greater than the number of tray supports.

The invention also includes a method of assembling a free-standing cable tray support structure. In this method, a plurality of vertical support posts that are longer than the height of the server racks is provided. A plurality of horizontal support members are then provided that are sized to have a length that will position the vertical support posts between the server racks when these members are connected to the vertical support posts. Next, the two sides of the support structure are assembled on the floor of the building by coupling the ends of the vertical support posts to the ends of the horizontal support members. In this step, one end of the plurality of vertical support posts forming the corners of the support structure are coupled to one end of one of the horizontal support members, while two abutting ends of the horizontal support posts are coupled one end of the vertical support posts forming the inside legs of the support structure. The two completed sides of the support structure are then raised and interconnected to form a table-like structure by bridging members. The bottom ends of the vertical support posts of the free-standing cable tray support structure are positioned at a desired location on a floor of a data center. Finally, the bottom ends of the vertical support posts are anchored to the floor of the data center. The method of the invention may be conducted on the floor of the data center or other building either before the installation of the server racks, in which case the server racks are installed between the floor-mounted vertical support posts of the completed support structure, or after the installation of the server racks, in which case the vertical support posts of the two completed sides are positioned between the support racks forming the sides of the array before being interconnected by the bridging members.

BRIEF DESCRIPTION OF THE SEVERAL DRAWINGS

DETAILED DESCRIPTION OF THE PREFERRED EMBODIMENT

Figure 1:
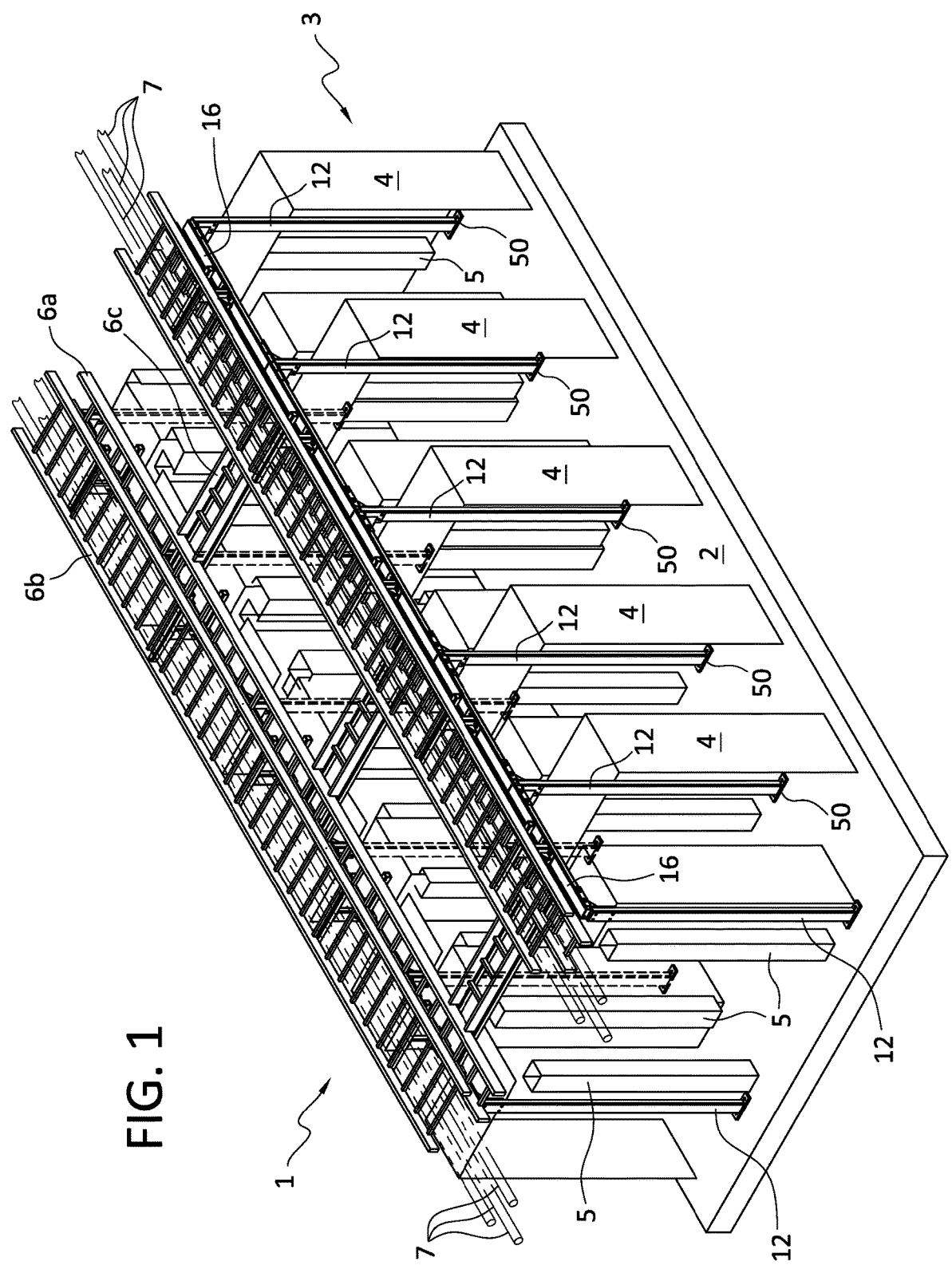
FIG. 1 is a perspective view of the cable tray support system of the invention installed over an array of server racks.

With reference to FIG. 1, the cable tray support structure 1 of the invention is free-standing, supported solely by the floor 3 of a data center or other building, and functions to support power and communication cables over a server rack array 3. Such an array 3 is typically formed from two opposing rows of individual server racks 4 and wire handlers 5. In each row, the server racks 4 and wire handlers 5 are closely spaced apart as shown. The support structure 1 supports lower and upper cable trays 6a and 6b over the two opposing rows of server racks 4 and wire handlers 5, as well as bridging cable trays 6c that extend across these two rows. The cable trays 6a, 6b, and 6c have a ladder-like structure, and hold a plurality of power and communication cables 7 along their respective longitudinal axes. The cables 7 in turn interconnect with the computer servers and other electronic equipment stacked within the server racks 4. It is important to note that the cable tray support structure 1 is not mechanically connected to any of the components of the server rack array 3, and hence does not rely upon the individual server racks 4 or wire handlers 5 for support. While not specifically shown in the drawings, in any data center there are typically ventilation plenums and ductwork mounted over the array 3, and it is important to note that the support structure 1 is not mechanically connected to any of these ventilation components as well.

Figure 2:
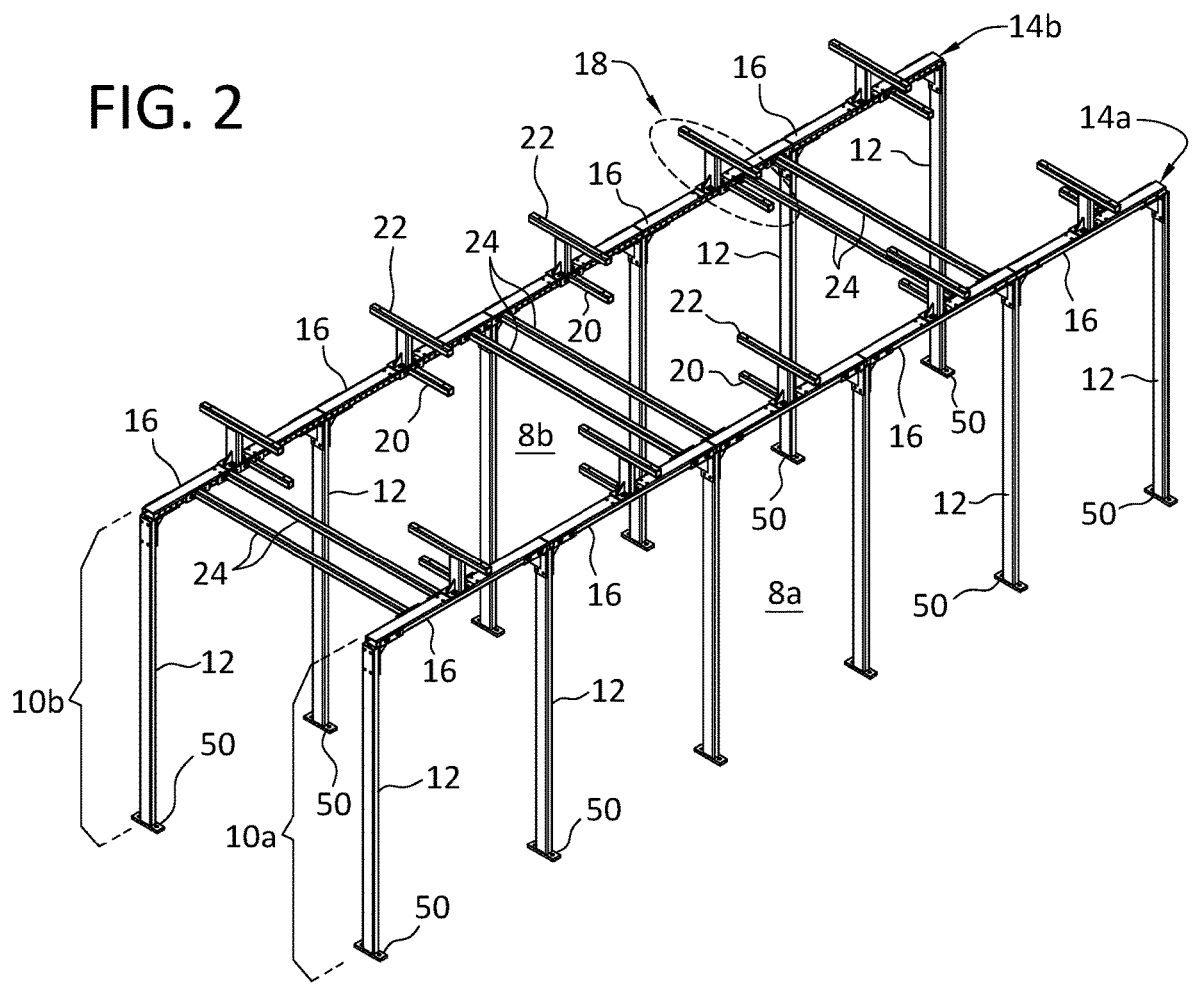
FIG. 2 is a perspective view of the cable tray support structure of FIG. 1 without the server racks and the cable trays so that the major components of the support structure may be more easily seen.
Figure 3A:
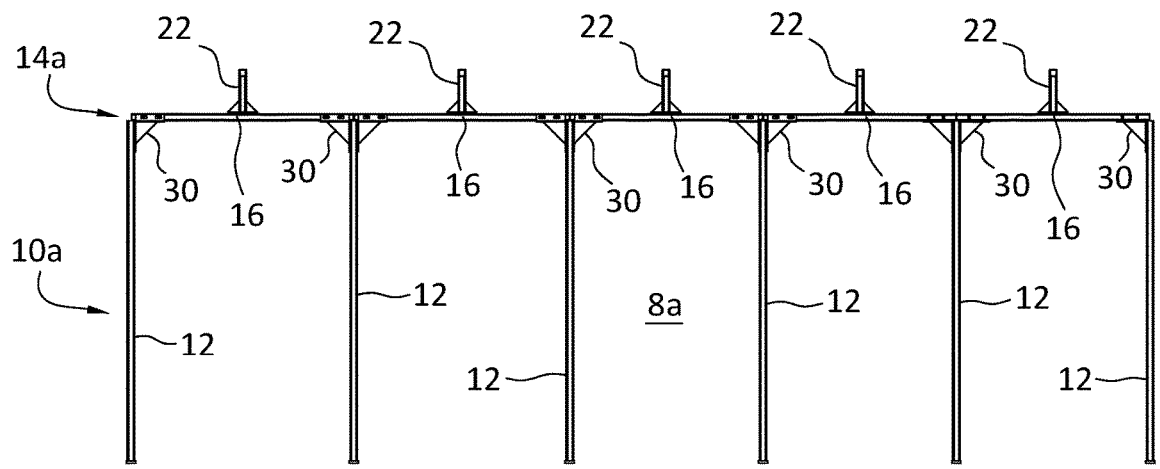
FIG. 3A is a side view of the cable tray support structure illustrated in FIG. 2.
Figure 3B:
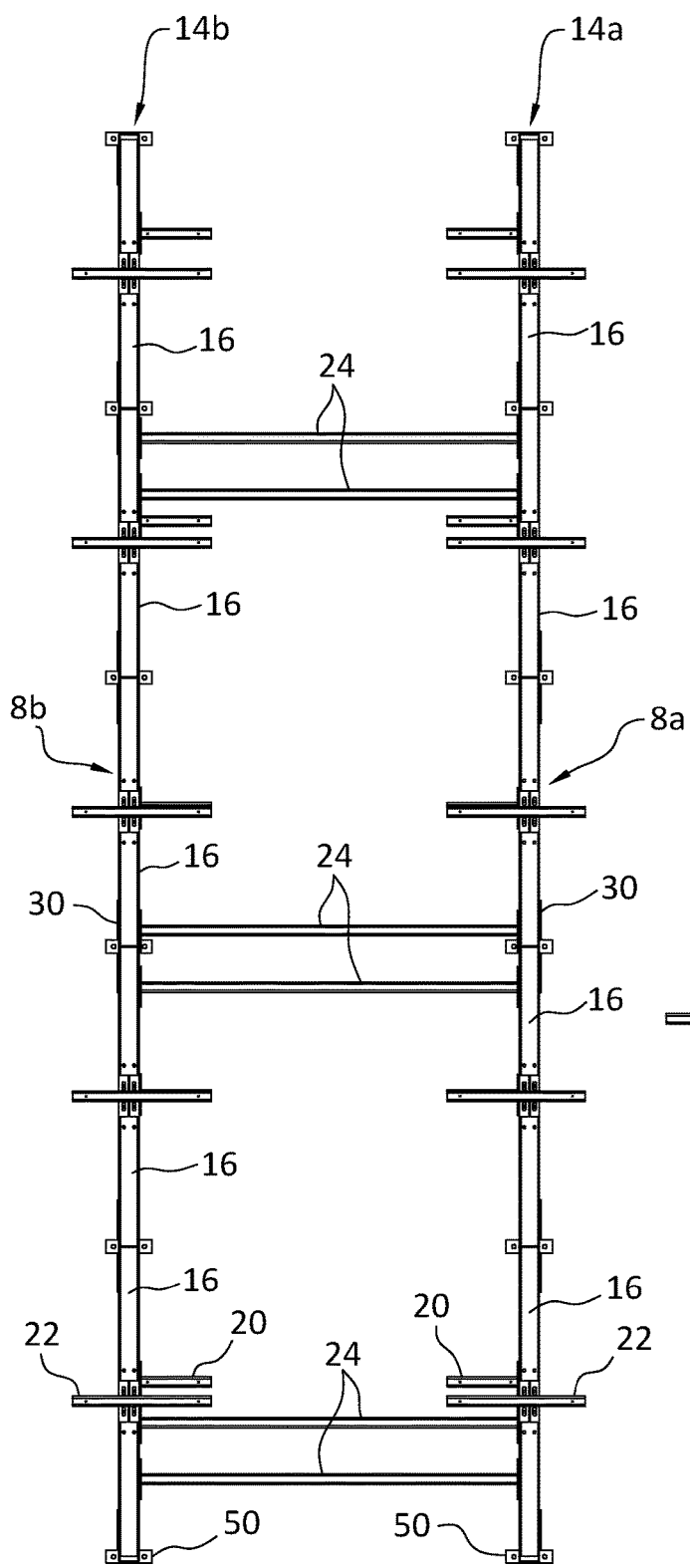
FIG. 3B is a top view of the cable tray support structure illustrated in FIG. 2.
Figure 3C:
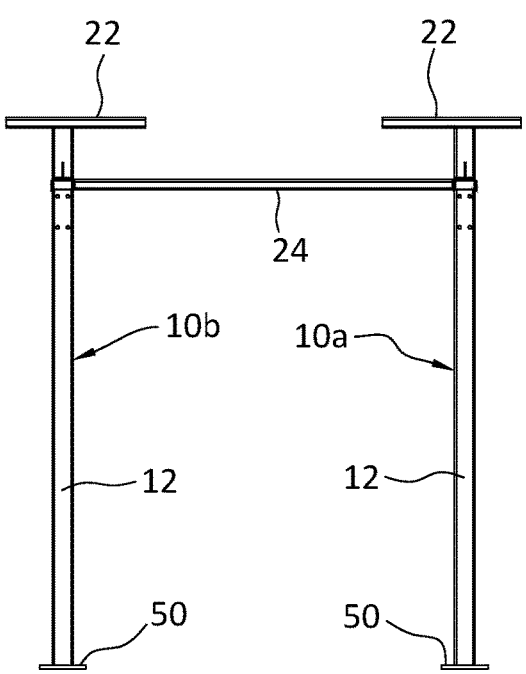
FIG. 3C is an end view of the cable tray support structure illustrated in FIG. 2.

With reference now to FIG. 2, the support structure 1 has two opposing sides 8a and 8b that are formed from a pair of columns 10a, 10b of vertical support posts 12, and a pair of rows 14a, 14b of horizontal support members 16 that interconnect the top ends of the support posts 12. As will be described in more detail hereinafter, abutting ends of the horizontal support members 16 overlap and are coupled to the top end of one of the vertical support posts 12. The horizontal support members 16 are sized so that the vertical support posts 12 coupled to their respective ends register with the small spaces provided between two adjacent server racks 4 of the server rack array 3. Such sizing allows the vertical support posts 12 to extend downwardly such that their bottom ends engage the floor 3 without mechanical interference from the individual server racks 4 and wire handlers 5 forming the server rack array 3. Both the support posts 12, support members 16, and other structural members of the support structure 1 are preferably formed from structural steel but may of course be formed from aluminum or non-ferrous alloys or even a carbon composite so long as the resulting support structure 1 is capable of handling the expected load of 131 lbs. per linear foot applied by the cables 7.

As shown in FIGS. 2 and 3A-3C, several types of tray supports 18 are connected to the pair of rows 14a, 14b of horizontal support members 16. These supports 18 include a plurality of tray support arms 20, a plurality of tray support brackets 22, and bridging members 24. The plurality of tray support arms 20 are cantilevered from the inside side surfaces of the pair of rows 14a, 14b of horizontal support members 16, and function to support the lower side cable trays 6a present on the sides 8a, 8b of the support structure 1. The plurality of tray support brackets 22 are mounted on the top surfaces of the pair of rows 14a, 14b of horizontal support members 16, and serve to support the upper side cable trays 6b present on the sides 8a, 8b of the support structure 1. The bridging members 24 are connected across the inside side surfaces of the pair of rows 14a, 14b of the horizontal support members 16, and perform the dual function of not only supporting the bridging cable trays 6c, but also interconnecting the sides 8a, 8b of the support structure 1 into a stable structure.

Figure 4A:
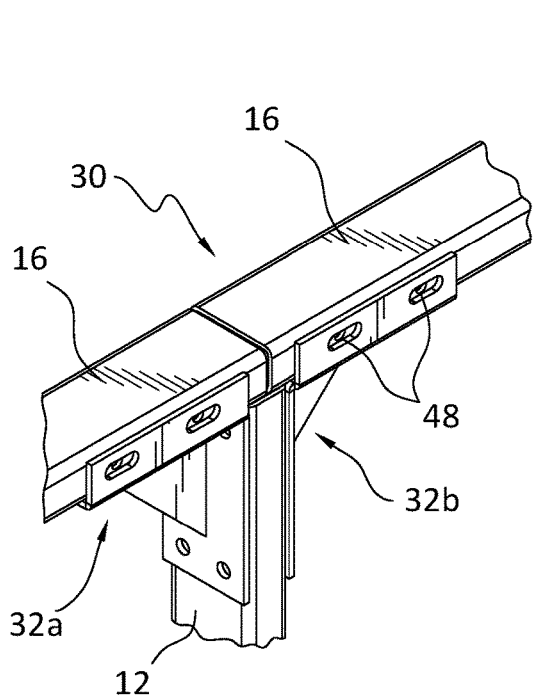
FIG. 4A is a perspective view of one of the coupling assemblies of the invention shown coupling together abutting end of two adjacent horizontal support members in overlapping relationship with one of the vertical support posts.
Figure 4B:
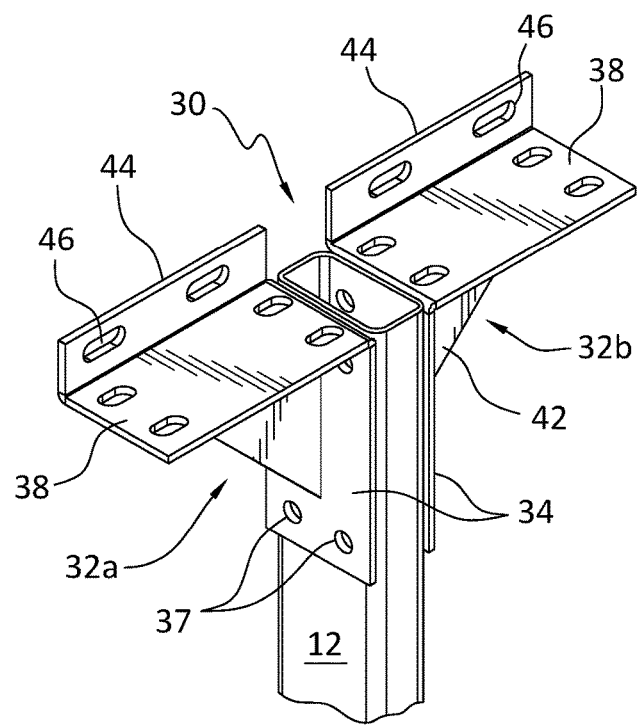
FIG. 4B is a perspective view of an opposite side of the coupling assembly illustrated in FIG. 4A without the two adjacent horizontal support members so that details of the coupling assembly may be more easily seen.

With specific reference to FIG. 4A, coupling assemblies 30 interconnect abutting ends of two horizontal support members 16 such that each end overlaps the top end of one of the vertical support posts 12. The coupling assemblies 30 include a pair of L-shaped brackets 32a, 32b disposed on opposing sides of the vertical support post 12. With reference to FIG. 4B, each of the L-shaped brackets 32a, 32b includes a vertical leg 34 mounted on a side of the top end of the vertical support post 12 via bolts (not shown) that extend through bolt holes 37. The L-shaped brackets 32a, 32b each further include a horizontal leg 38 that is connected to one of the ends of the horizontal support members 16 via bolts (not shown) that extend through elongated bolt holes 39. A 45° reinforcing flange 42 is integrally provided between the vertical and horizontal legs 34, 38 for proving extra strength the coupling assembly 30. Finally, a mounting flange 44 extends upwardly from the horizontal leg 38 of each of the L-shaped brackets 32a, 32b, which is joined to a side of the horizontal support member 16 via bolts (not shown) that extend through the elongated bolt holes 46. A series of uniformly-space bolt holes 48 (best seen in FIG. 4E) is present along at least one of the sides of each of the horizontal support members 16. Both the spacing between the bolt holes 48 and the positioning of the bolts holes 48 relative to the ends of each of the horizontal support members 16 is the same. The spacing and positioning of the bolt holes 48 is selected such that the bolt holes 46 of the mounting flanges 44 of each of the L-shaped brackets 32A, 32b will register with the bolts holes 48 located at the ends of the horizontal support members 16.

The mounting flange 44 functions not only to strengthen the joint created by the coupling assembly 30, but also ensures proper alignment of the horizontal support members 16 and proper positioning of the ends of the horizontal support members 16 over the top end of the vertical support post 12. The fact that the coupling assemblies 30 secure the ends of the horizontal support members 16 in overlapping relationship with the top ends of the vertical support posts 12 effectively focuses the vertical load applied by the horizontal support members 16 from the cable trays 6a, 6b, and 6c to the vertical support posts 12 and away from the joint 30 itself. The pair of opposing L-shaped brackets 32a, 32b that form the coupling assemblies advantageously reinforces the strength of the opposing ends of the horizontal support members 16 and the top end of the support post 12 where the vertical load from the cable trays 6a, 6b, and 6c is focused, and effectively distributes this vertical load over a broader area, thereby reducing the magnitude of localized stresses. The use of horizontal support members 16 whose length is sized to space the vertical support posts 12 between the small spaces between the server racks 4 of the array 3 in combination with the coupling assemblies 30 allows a single joint--formed by the coupling assembly 30—to both join the horizonal support members 16 together in a row and join the horizontal support members 16 to the vertical support posts 12 without the need for a length adjustment mechanism in the support members 16 or additional joints that merely splice together two horizontal support members 16.

Figure 4C:
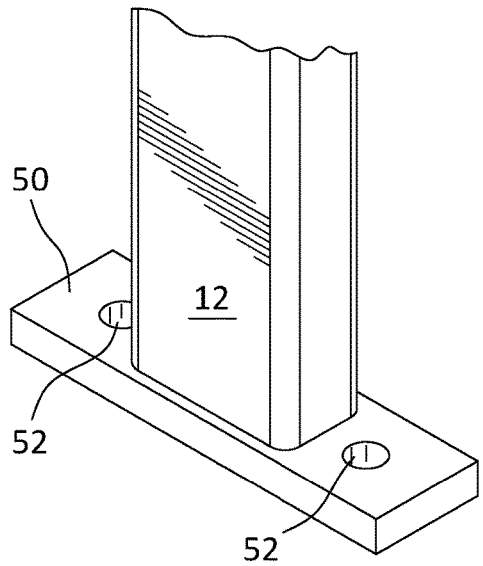
FIG. 4C is a perspective view of one of the floor mounts of the invention.

FIG. 4C illustrates the floor mounts used to secure the bottom ends of the vertical support posts 12 to the floor 3. In the preferred embodiment, these floor mounts take the form of a floor flange 50 that is welded or otherwise affixed to the bottom end of the support post 12. The floor flange 50 includes bolt holes 52 for receiving mounting bolts (not shown) in order to secure the flange 50 and the bottom end of the vertical support post 12 to the floor 3. While the floor mount of the preferred embodiment is a rectangular flange that is bolted to the floor, the floor mount may take any form that effective secures the bottom ends of the vertical posts 12 to the floor 3, including industrial adhesives. As it is more important for the floor mounts to secure the bottom ends of the vertical support posts into a desired position on the floor 3, rather than to the floor itself, such floor mounts may also comprise recesses provided in the floor 3 that receive the bottom ends of the posts 12.

Figure 4D:
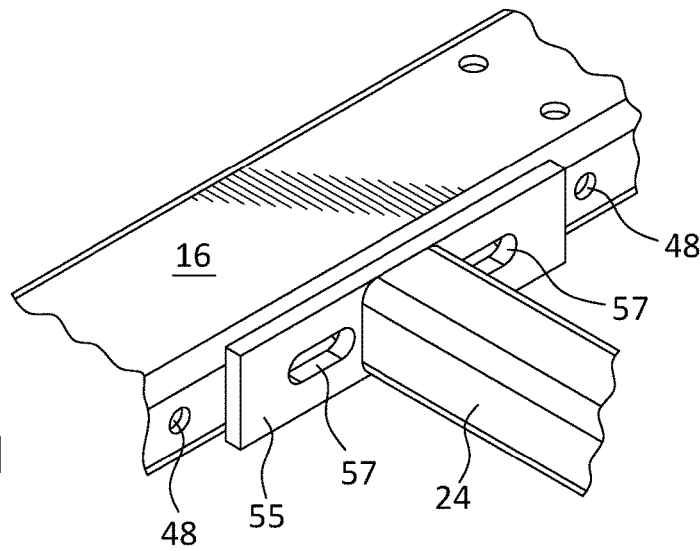
FIG. 4D is a perspective view of an end portion of one of the bridging member of the support structure, illustrating how it is attached to one of the vertical support members.

FIG. 4D illustrates the mounting flange 55 for the bridging members 24. Mounting flange 55 is preferably rectangular in shape, and is welded to the ends of the bridging members 24. The mounting flange 55 includes elongated bolt holes 57 registrable with the bolt holes 48 in the horizontal support members 16 so that mounting bolts (not shown) may be easily used to secure the flange 55 to one of the horizontal support members 16. Because the bolt holes 48 extend along the entire length of the horizontal support members 16, the bolt holes 48 define a series of affixing sections along the members 16, thereby advantageously providing flexibility in the positioning of the bridging members 24 across the two sides 8a, 8b of the support structure 1. A preferred configuration of the bridging members 24 is illustrated in FIG. 2. Here, three uniformly spaced pairs of bridging members 24 secure the two sides 8a, 8b of the support structure 1 into a table-like structure. Each pair of bridging members 24 is spaced apart a distance that is a bit less than the distance between the sides of the bridging tray 6c it supports so as to avoid any twisting of the bridging tray 6c should the cables 7 become stacked more on one side of the tray 6c than the other.

Figure 4E:
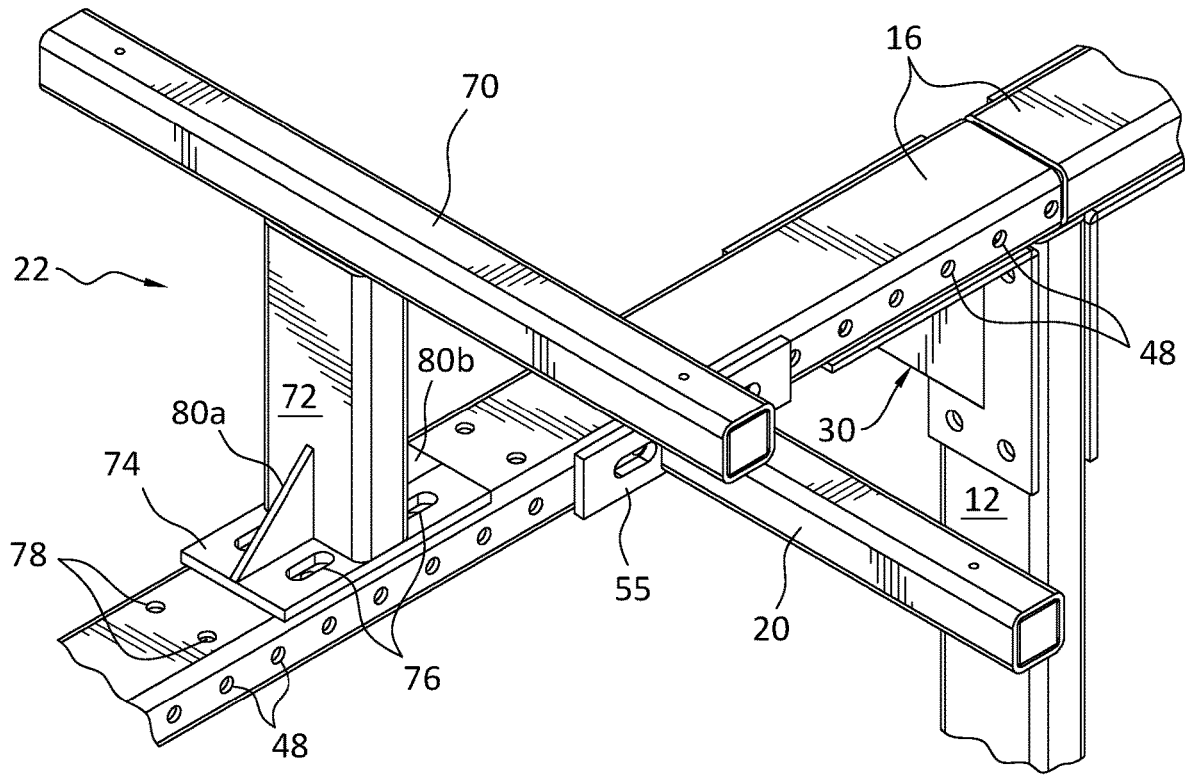
FIG. 4E is a perspective view of one of the tray support arms that supports a lower side cable tray, and a tray support bracket that support an upper side cable tray.

FIG. 4E illustrates how the tray support arms 20 and the tray support brackets 22 are mounted on the horizontal support members 16. Each of the tray support arms 20 includes a rectangular mounting flange 60 welded to one end thereof. Like the previously-described mounting flange 55 for the bridging members 24, the mounting flange 60 of the tray support arms includes a pair of elongated bolt holes 57 registrable with the series of bolt holes 48 present along the side of each of the horizontal support members 16. Bolts (not shown) are used to mount, in cantilever fashion, one end of the tray support arms 20 with the side of one of the horizontal support members 16.

Figure 4F:
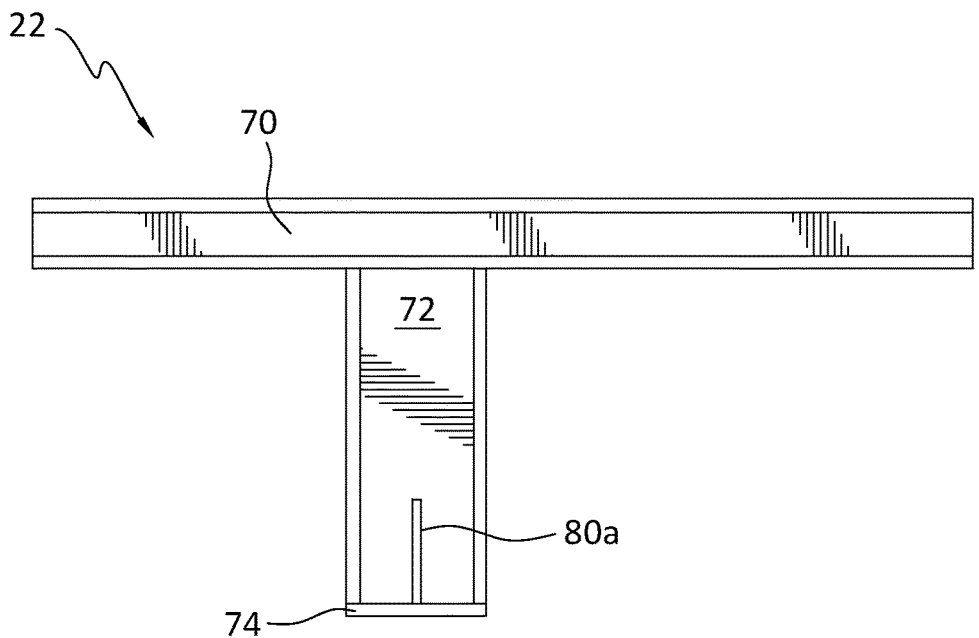
FIG. 4F is a front view of the tray support bracket illustrated in FIG. 4E.

Turning now to both FIGS. 4E and 4F, each of the tray support brackets 22 includes a horizontal tray support 70 that directly supports an upper side cable tray 6b, and a vertically-oriented riser member 72. The horizontal tray support 70 is not cantilevered at one end to the riser member 72, but instead is connected near its mid-point to the riser member 72. Since the upper side cable trays 6b have about twice the width of the lower side cable trays 6a and can carry more cables, such central support balances the moment arm forces in the connection between the horizontal tray support 70 and the riser member 72. As is best seen in FIG. 4F, the connection between the horizontal tray support 70 and the riser member 72 is preferably a bit off-center toward the left. Such positioning extends most of the upper side cable tray 6b toward inside of the array 3 of server racks 4. This allows the upper side trays 6b to be more accessible when the cables are placed into them, since the cables 7 will be generally be lifted up and laid into the upper side tray 6b from the inside of the array 3.

The riser member 72 connects the horizontal tray support 70 to a mounting flange 74. The mounting flange 74 is rectangular and includes a pattern of elongated bolt holes 76. This pattern of bolt holes 76 is registrable with one of a series of bolt hole patterns 78 that are uniformly spaced along the length of the upper face of each of the horizontal support members 16. The series of bolt hole patterns 78 defines a plurality of cable tray support affixing sections along the lengths of the horizontal support members 16. There are more bolt hole patterns 78 than tray support brackets 22 such that the assembler of the support structure 1 has the option of positioning the tray support brackets 22 at any one of a number of positions along the horizontal support members 16. Reinforcing flanges 80a, 80b are provided between the mounting flange 74 and the riser member 72 to strengthen the mounting flange 74 and the resulting connection between the tray support bracket 22 and one of the horizontal support members 16.

Figure 5:
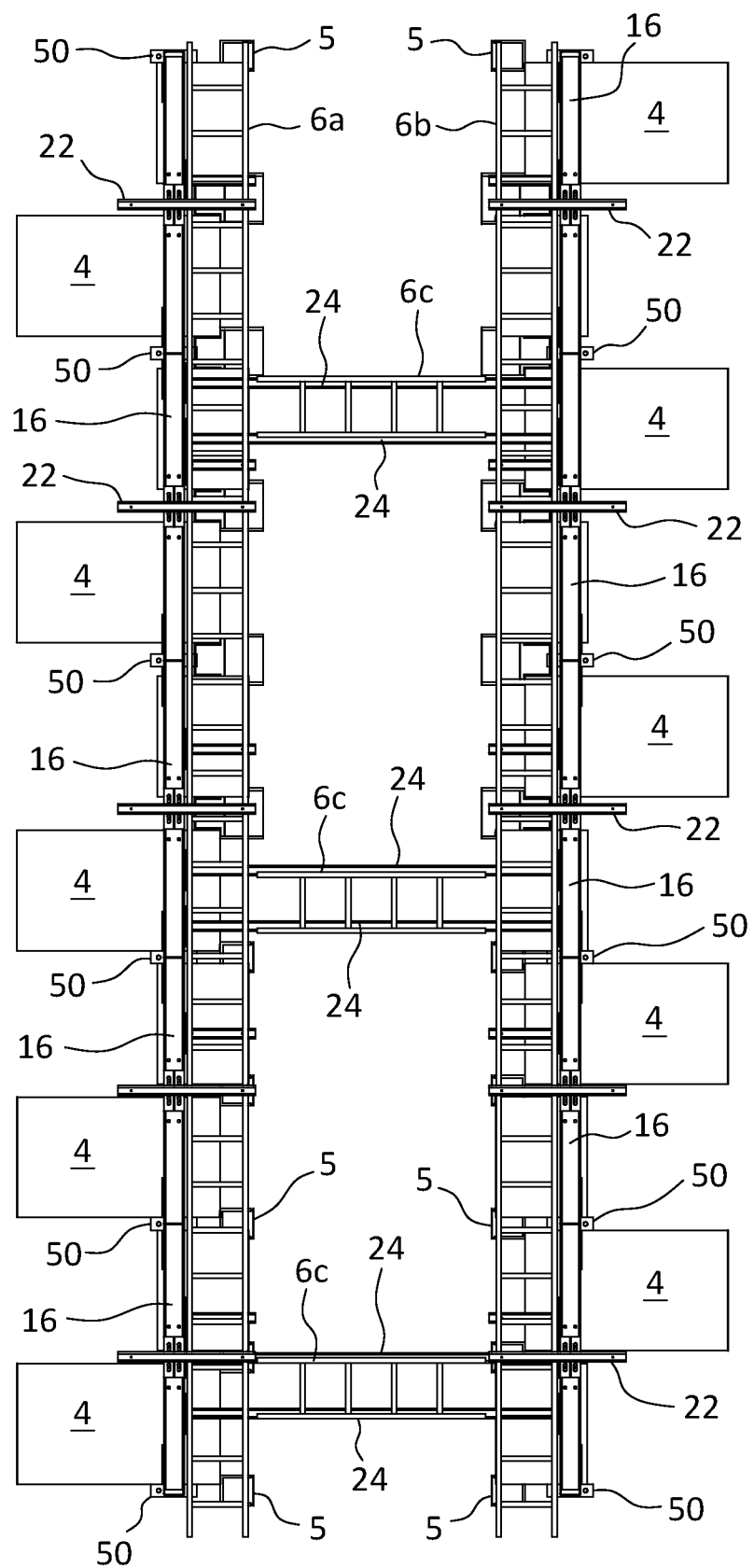
FIG. 5 is a top view of the cable tray support structure of the invention installed over an array of server racks with only the lower side and bridging cable trays assembled thereon.

FIG. 5 is a top view of the support structure 1 over an array 3 of server racks 4 with only the lower side cable trays 6a and the bridging trays 6c installed. The lower side cable trays 6a and the bridging trays 6c are at the same height. While not specifically shown in the drawings, the servers and other electronic equipment stacked within the server racks 4 are accessible from the inside of the array 3, and the communication and power cables that interconnect these components consequently are installed along the inside sides of the array 3. This is why the cantilevered support arms 20 support the lower side cable trays 6a along the inner perimeter of the array 3, and why the bridging trays 6c traverse the inside of the array 3. Such positioning of the cable support trays 6a and 6c allows the cables 7 to be easily lifted, laid into, and dragged along the trays during installation.

Figure 6:
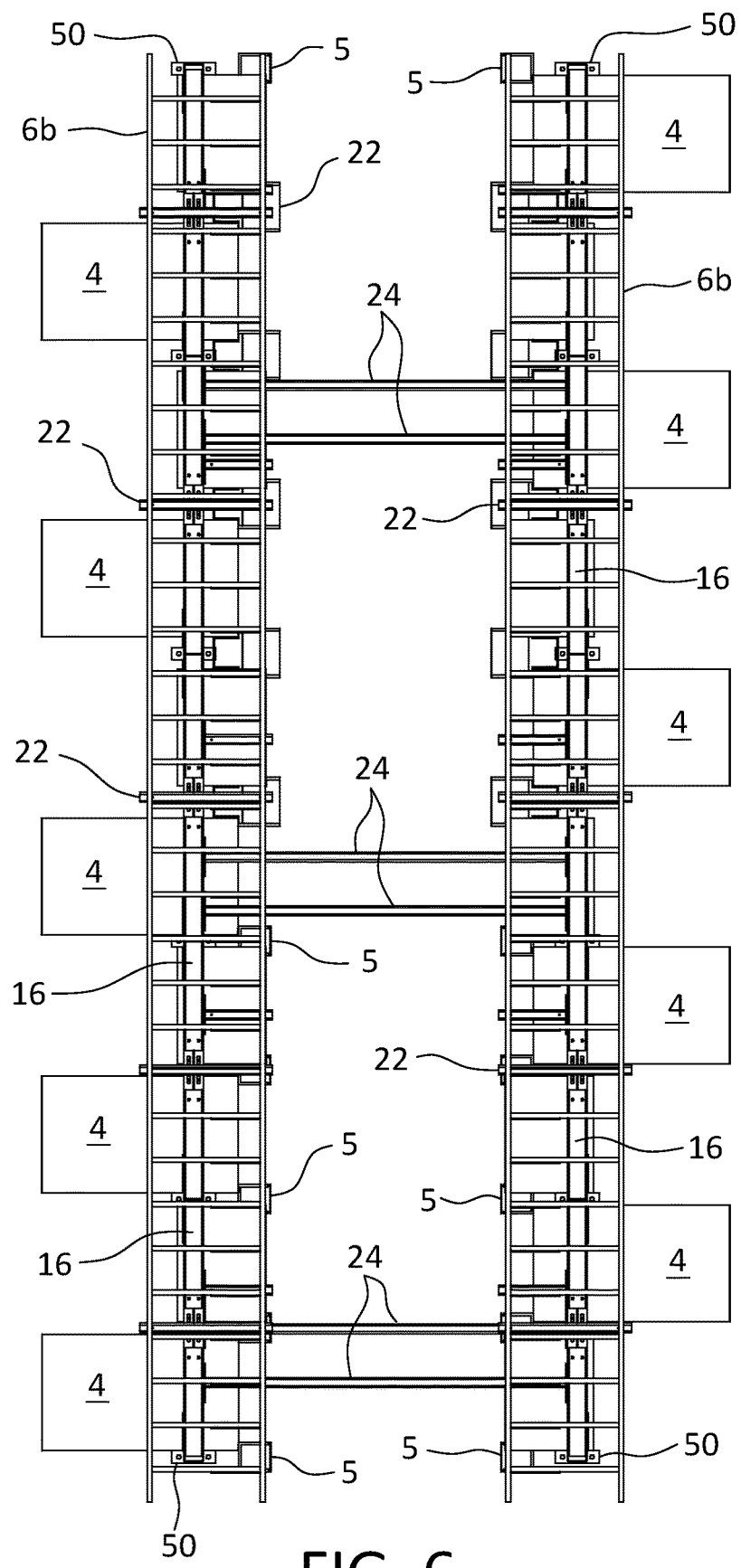
FIG. 6 is a top view of the cable tray support structure of the invention installed over an array of server racks with only the upper cable trays assembled thereon.
Figure 7:
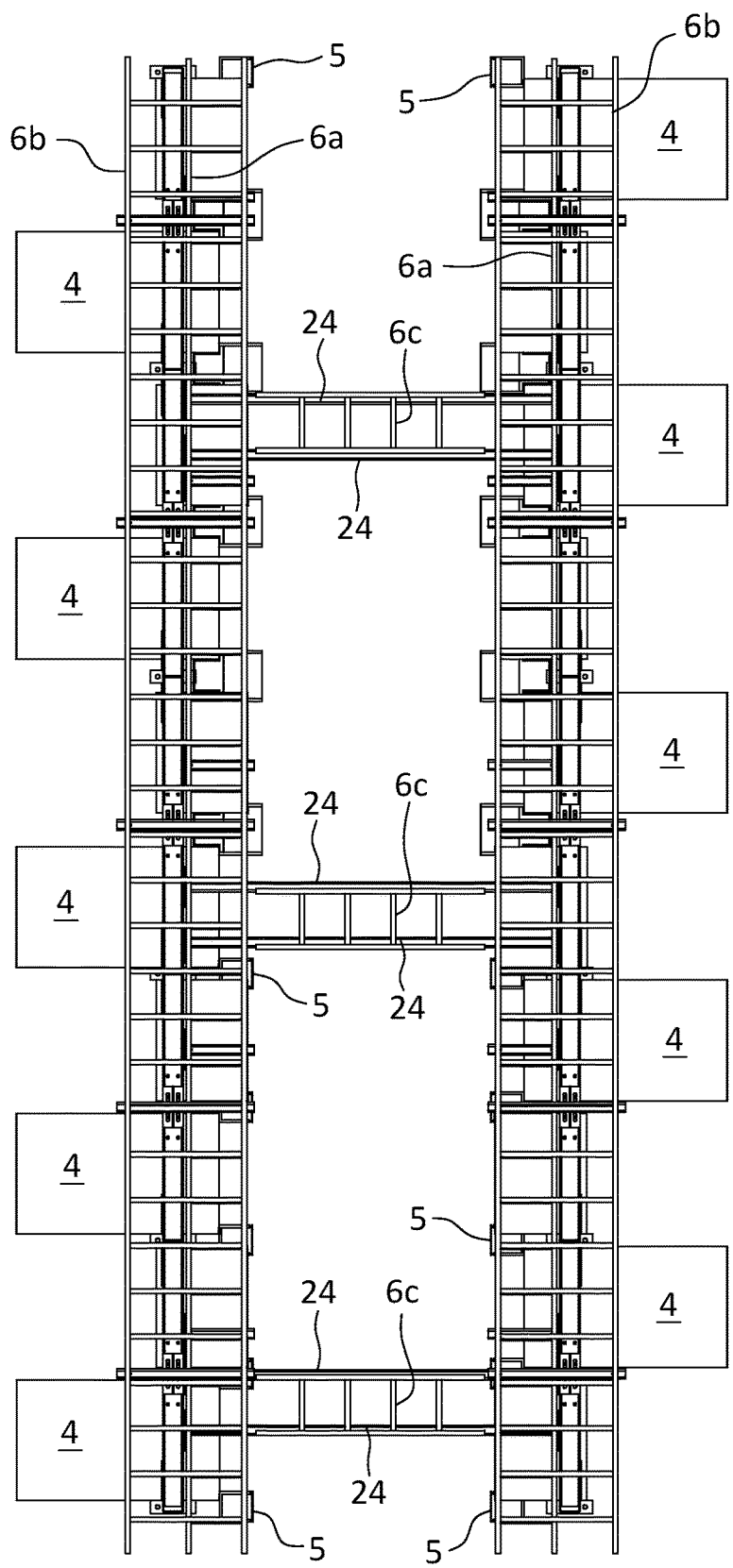
FIG. 7 is a top view of the cable tray support structure of the invention installed over an array of server racks with all of the cable trays assembled thereon.

FIG. 6 is a top view of the support structure 1 over an array 3 of server racks 4 with only the upper side cable trays 6b installed. Note how the off-center connection between the horizontal tray support 70 to the riser member 72 of the brackets 22 positions most of the area of the upper side cable trays 6b toward the inside sides of the array 3. FIG. 7 is a top view of the support structure 1 over an array 3 of server racks 4 with all of the cable trays 6a, 6b, and 6c installed.

The invention further encompasses a method of assembling the cable tray support structure 1. In the first step of the method, a plurality of vertical support posts 12 are provided having a top end that extends above the height of an array 3 of server racks 4 where the support structure is to be installed. Next, a plurality of horizontal support members 16 are provided that are sized to have a length that will align the vertical support posts 12 between the server racks 4 forming the array 3 when the abutting ends of two of the horizontal support members 16 are mounted over the top end of one of the vertical support members 16. In the next step, the two L-shaped brackets 32a, 32b of the coupling assembly 30 are mounted on either side of the top ends of the vertical support posts 12. Next, the two sides 8a, 8b of the support structure are assembled by coupling two horizontal support members 16 over the top end of the vertical support posts 12. This step may be accomplished with the vertical support posts 12 lying on their sides on the floor 3 of the building. It should be noted that only one horizontal support member 16 is coupled over the top end of the vertical support posts 12 that form the corners of the support structure 12. The two completed sides 8a and 8b are then swung up in parallel relationship so that the bottom ends of the vertical support posts 12 engage the floor. The bridging members 24 are next connected between the two completed sides 8a, 8b. The cable tray supports 18 (i.e. the tray support arms 20 and tray support brackets 22) are then connected to the two rows 14a, 14b of the horizontal support members. The cable trays 6a, 6b and 6c are then installed over the tray support arms, the tray support brackets 22, and the bridging members 24.

The support structure 1 may be assembled over an installed array 3 of server racks 4, in which case the vertical support posts 12 of the two sides 8a, 8b are slid between the racks 4 prior to the installation of the bridging members 24. Alternatively, the support structure 1 may be assembled before the installation of the array 3 of server racks, in which case the individual racks 4 are placed between the vertical support posts. In either case, after the bottom ends of the vertical support posts 12 are in their desired position between the server racks 4, the bottom ends of the vertical support posts 12 are then secured into place by bolting the floor mounting flanges 50 to the floor 3.

After the assembly of the support structure 1 and installation of the array of server racks 4, the cables 7 are lifted and laid into place into the cable trays 6a, 6b, and 6c from the inside of the server rack array 3.

The invention claimed is:

1. A method of assembling a free-standing cable tray support structure that supports cables above an array of electronic equipment racks disposed on a floor of a data center, comprising the steps of:
   providing a plurality of vertical support posts that are longer than the height of the electronic equipment racks;
   providing a plurality of horizontal support members having lengths that space the plurality of vertical support posts in spaces between the electronic equipment racks of the array when the vertical support posts are coupled to the horizontal support members;
   assembling within the data center the vertical support posts and horizontal support members into a completed, free-standing cable tray support structure by:
      coupling together top ends of the plurality of vertical support posts with the plurality of horizontal support members to form a free-standing cable tray support structure supported only by bottom ends of the vertical support posts engaging the floor;
      positioning the bottom ends of the vertical support posts of the free-standing cable tray support structure at a location on the floor of the data center such that the electronic equipment racks are positioned in spaces between the vertical support posts , and
      anchoring the bottom ends of the vertical support posts to the floor of the data center,
   wherein the completed free-standing cable tray support structure is mechanically independent from the array of electronic equipment racks which directly engage and are supported solely by the floor of the data center.

2. The method of assembling a free-standing cable tray support structure defined in claim 1, wherein the electronic equipment racks are arranged between adjacent vertical support posts after the cable tray support structure has been assembled.

3. The method of assembling a free-standing cable tray support structure defined in claim 1, wherein the electronic equipment racks are arranged in an array on the floor of the data center before the cable tray support structure is assembled.

4. The method of assembling a free-standing cable tray support structure defined in claim 1, wherein the data center includes a ventilation system and the free-standing support structure is mechanically independent from the ventilation system.

5. A method of assembling a free-standing cable tray support structure that supports cables above an array of electronic equipment racks disposed on a floor of a data center, comprising the steps of:
   providing a plurality of vertical support posts that are longer than the height of the electronic equipment racks;
   providing a plurality of horizontal support members having lengths that space the plurality of vertical support posts between the electronic equipment racks of the array when the vertical support posts are coupled thereto;
   assembling at the data center the vertical support posts and the horizontal support members by
      connecting the top ends of the vertical support posts with the horizontal support members to form a free-standing cable tray support structure supported only by the bottom ends of the vertical support posts engaging a floor;
      positioning the bottom ends of the vertical support posts of the free-standing cable tray support structure at a desired location on a floor of a data center such that the electronic equipment racks are positioned in spaces between the vertical support posts;
      securing the bottom ends of the vertical support posts to the floor of the data center to form a free-standing cable tray support structure,
   wherein the electronic equipment racks engage the floor of the data center and are not mechanically supported by the completed free-standing cable tray support structure.

6. The method of assembling a free-standing cable tray support structure defined in claim 5, wherein the electronic equipment racks are arranged on the floor of the data center between adjacent vertical support posts after the cable tray support structure has been assembled.

7. The method of assembling a free-standing cable tray support structure defined in claim 5, wherein the electronic equipment racks are arranged in an array on the floor of the data center before the cable tray support structure is assembled.

8. The method of assembling a free-standing cable tray support structure defined in claim 5, wherein the data center includes a ventilation system and the free-standing support structure is mechanically independent from the ventilation system.

* * * * *